United States Patent
Teng et al.

(10) Patent No.: US 9,103,032 B2
(45) Date of Patent: Aug. 11, 2015

(54) APPARATUS AND METHOD FOR FORMING THIN FILMS IN SOLAR CELLS

(71) Applicant: TSMC Solar Ltd., Taichung (TW)

(72) Inventors: Edward Teng, Sunnyvale, CA (US);
Ying-Chen Chao, Hsinchu (TW);
Chih-Jen Yang, Taichung (TW)

(73) Assignee: TSMC Solar Ltd., Taichung ( * ) Notice: Subject to any disclaimer, the term of this patent is extended or adjusted under 35 U.S.C. 154(b) by 0 days.

(21) Appl. No.: 13/672,777

(22) Filed: Nov. 9, 2012

(65) Prior Publication Data
US 2014/0131193 A1   May 15, 2014

(51) Int. Cl.
| C23C 14/34 | (2006.01) |
| C23C 14/54 | (2006.01) |
| C23C 14/24 | (2006.01) |
| C23C 14/50 | (2006.01) |
| C23C 14/56 | (2006.01) |
| C23C 14/00 | (2006.01) |
| C23C 14/58 | (2006.01) |
| C23C 14/04 | (2006.01) |

(52) U.S. Cl.
CPC ............... *C23C 14/54* (2013.01); *C23C 14/00* (2013.01); *C23C 14/044* (2013.01); *C23C 14/24* (2013.01); *C23C 14/34* (2013.01); *C23C 14/3464* (2013.01); *C23C 14/505* (2013.01); *C23C 14/541* (2013.01); *C23C 14/56* (2013.01); *C23C 14/564* (2013.01); *C23C 14/568* (2013.01); *C23C 14/5806* (2013.01)

(58) Field of Classification Search
CPC ...... C23C 14/34; C23C 14/24; C23C 14/568; C23C 14/564; C23C 14/5806; C23C 14/00; C23C 14/024; C23C 14/04; C23C 14/044
See application file for complete search history.

(56) References Cited

U.S. PATENT DOCUMENTS

| 3,773,541 A * | 11/1973 | Ng et al. ..................... 427/10 |
| 3,962,488 A * | 6/1976 | Gillery ..................... 427/109 |
| 4,992,153 A * | 2/1991 | Bergmann et al. ....... 204/192.16 |
| 5,618,388 A * | 4/1997 | Seeser et al. ............. 204/192.12 |
| 2011/0030794 A1 | 2/2011 | Teng |

* cited by examiner

Primary Examiner — Jason M Berman
(74) Attorney, Agent, or Firm — Duane Morris LLP; Steven E. LLP

(57) ABSTRACT

Apparatus for forming a solar cell comprises a housing defining a chamber including a substrate support. A sputtering source is configured to deposit particles of a first type over at least a portion of a surface of a substrate on the substrate support. An evaporation source is configured to deposit a plurality of particles of a second type over the portion of the surface of the substrate. A cooling unit is provided between the sputtering source and the evaporation source. A control system is provided for controlling the evaporation source based on a rate of mass flux emitted by the evaporation source.

16 Claims, 5 Drawing Sheets

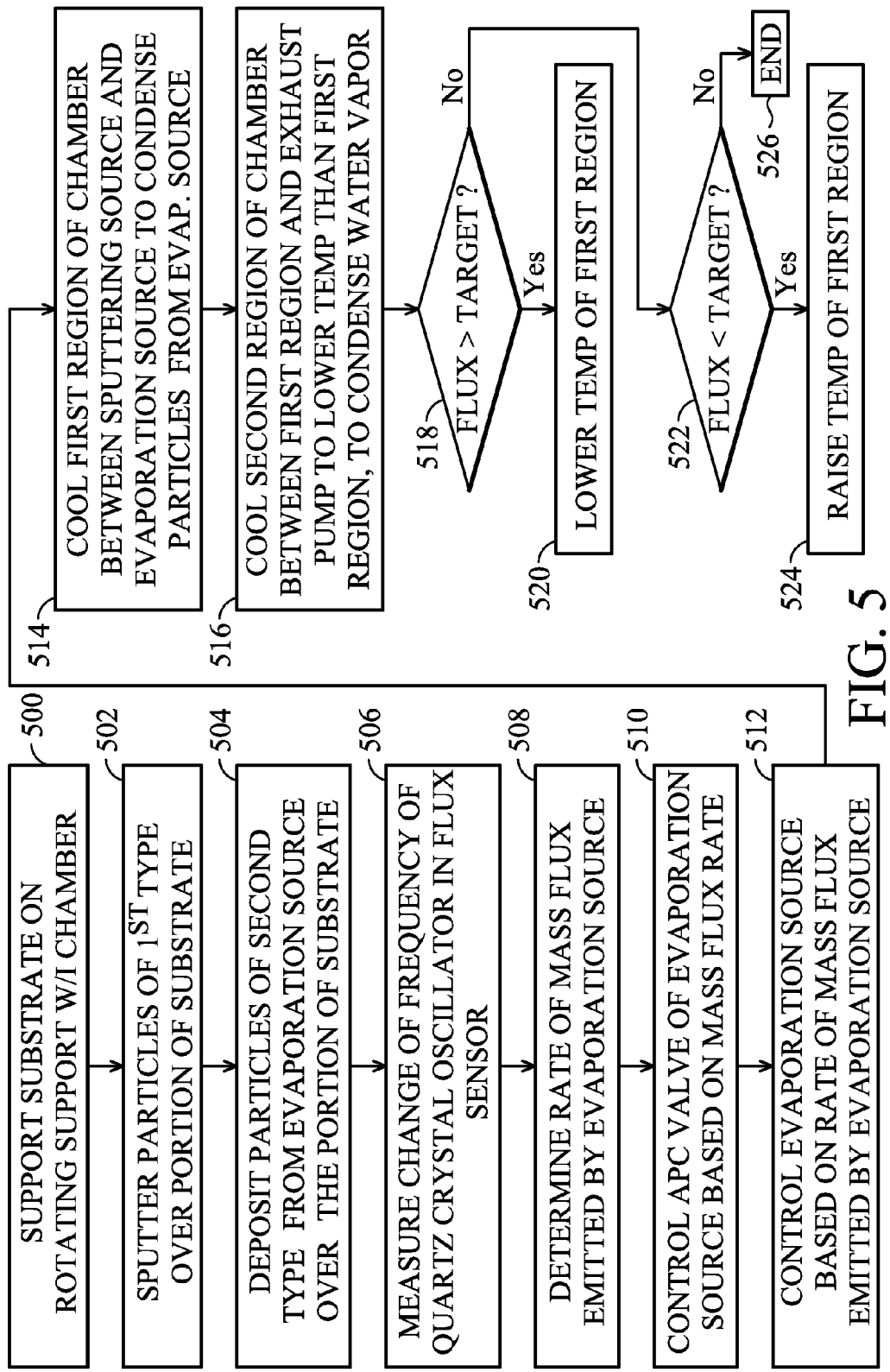

US 9,103,032 B2

APPARATUS AND METHOD FOR FORMING THIN FILMS IN SOLAR CELLS

FIELD

The present disclosure relates generally to the field of photovoltaics, and more specifically to an apparatus and method for forming thin films in solar cells or panels.

BACKGROUND

Copper indium gallium (di)selenide (CIGS) is a commonly used absorber layer in thin film solar cells. CIGS thin film solar cells have achieved excellent conversion efficiency (>20%) in laboratory environments. Most conventional CIGS deposition is done by one of two techniques: co-evaporation or selenization. Co-evaporation involves simultaneously evaporating copper, indium, gallium and selenium. The different melting points of the four elements makes controlling the formation of a stoichiometric compound on a large substrate very difficult. Additionally, film adhesion is very poor when using co-evaporation. Selenization involves a two-step process. First, a copper, gallium, and indium precursor is sputtered on to a substrate. Second, selenization occurs by reacting the precursor with toxic $H_2Se/H_2S$ at 500° Celsius or above. Because this two-step reaction involves both gas (Se, or $H_2Se$) diffusion and chemical reaction, the film composition profile is also difficult to control.

BRIEF DESCRIPTION OF THE DRAWINGS

FIG. 5 is a flow chart of a method of using the apparatus of FIGS. 1-4.

DETAILED DESCRIPTION

Figure 1:
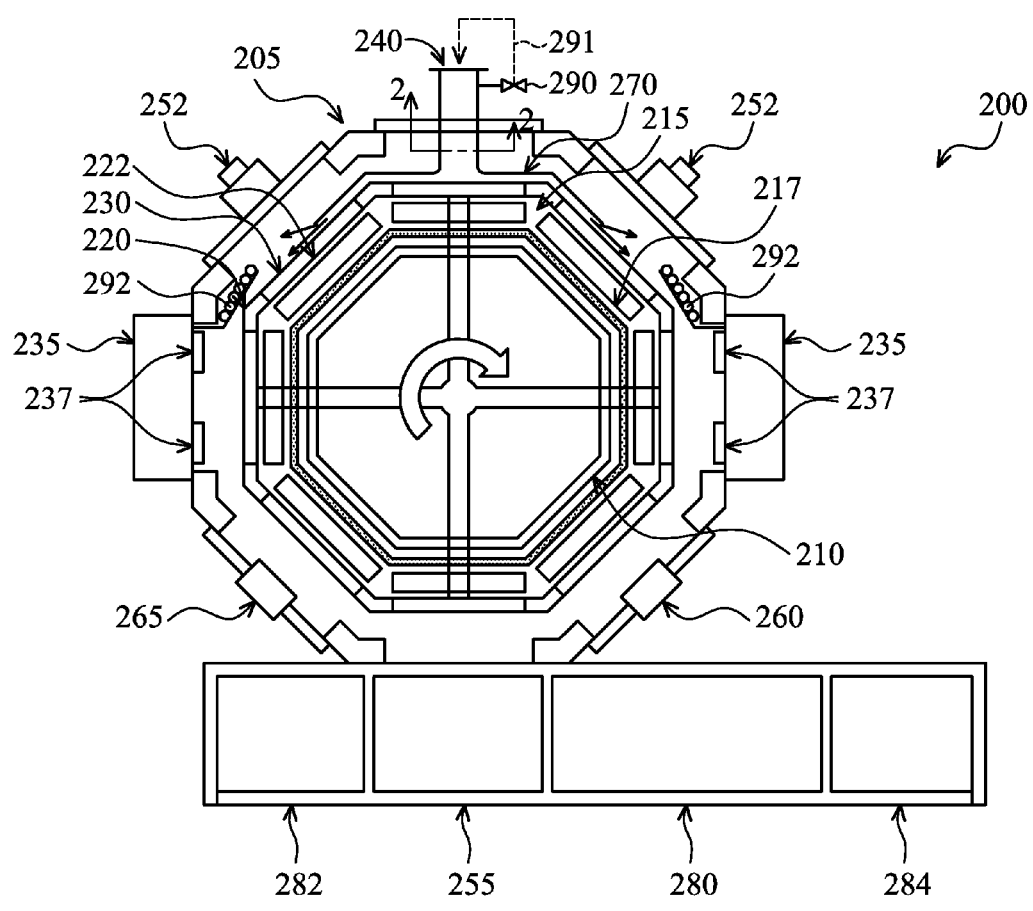
FIG. 1 is a plan view of a material deposition apparatus.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 is a schematic top plan view of an example of a CIGS solar cell forming apparatus 200 according to some embodiments of the present disclosure. The apparatus is configured for depositing alternating layers of a first type of particles and a second type of particles on a solar cell or solar panel substrate.

In various embodiments, apparatus 200 can include a housing 205 defining a vacuum chamber. A rotatable substrate support 220 is configured to hold a plurality of substrates 230 on a plurality of surfaces 222. A first sputtering source 235 is configured to deposit a plurality of absorber layer particles of a first type over at least a portion of a surface of each of the plurality of substrates 230. An evaporation source 240 is configured to deposit a plurality of absorber layer particles of a second type over at least a portion of the surface of each of the plurality of substrates 230.

In embodiments described herein, to maintain a stable sputtering rate, the sputtering targets 237 of sputtering source 235 are not contaminated by the selenium vapor from evaporation source 240. In some embodiments, a cooling unit is located between the sputtering source 235 and the evaporation source 240. In some embodiments, mass flux rate feedback signals representing mass flux emitted by the evaporation source are used to control the rate of material delivery by the evaporation source 240. In some embodiments, the evaporation source 240 has an aperture configured to provide a substantially uniform film thickness on the substrate.

In some embodiments, a first isolation pump 252 is configured to isolate the evaporation source 240 from the first sputtering source 235. In some embodiments, a second sputtering source 235 is configured to deposit a plurality of absorber layer particles of a third type over at least a portion of the surface of each of the plurality of substrates 230. A second isolation pump is configured to isolate the evaporation source 240 from the second sputtering source 235.

In embodiment of FIG. 1, apparatus 200 includes a rotatable drum 210, a heater apparatus 215 including a plurality of heaters 217, an isolation baffle 270, a load lock chamber 282, an unload lock chamber 284, a monitoring device 260, and sputtering targets 237 in each of the first and second sputtering sources 235. The isolation baffle 270 is configured to prevent the vapor emitted by evaporation source 240 from reaching and contaminating the sputter targets 237 of the sputtering source 235. In some embodiments, apparatus 200 includes a buffer layer deposition source 265. In the illustrated embodiment, buffer layer deposition source 265 is disposed along an interior perimeter surface of housing 205. In some embodiments, buffer layer deposition source 265 is disposed in a subchamber of the vacuum chamber. In some embodiments, buffer layer sputtering source 265 is configured to deposit an n-type buffer layer, such as for example, a cadmium sulfide (CdS) buffer layer, or a ZnS—O buffer layer, over the absorber layer. The buffer layer can include any suitable buffer layer material.

In the embodiment of FIG. 1, the first and second isolation pumps are vacuum pumps 252, configured to respectively isolate the first and second sputtering sources 235 from the evaporation source 240. In some embodiments (not shown), one or more of the isolation pumps 252 is configured to maintain the pressure in an evaporator source 240 sub-chamber (not shown) lower than the pressure in the vacuum chamber. The isolation pumps 252 can be configured to evacuate second type absorber layer particles (emitted by evaporation source 240) from the vacuum chamber, prevent diffusion of the second type absorber layer particles into the sputtering targets 237, and prevent the second type absorber layer particles from contaminating the two sputtering sources 235. In some embodiments, apparatus 200 can include an loading/unloading substrate chamber 255 and post-treatment chamber 280. In various embodiments, post-treatment chamber 280 can be configured for post treatment of the CIGS cell such as, for example, cooling the CIGS cell.

In various embodiments, the housing 205 can be shaped as a polygon. For example, in FIG. 1, the housing 205 is octagon shaped. In various embodiments, the housing 205 has one or more removable doors built on one or more sides of the vacuum chamber. The housing 205 can be composed of stainless steel or other metals and alloys used for drum coater housings. For example, the housing 205 can define a single vacuum chamber having a height of approximately 2.4 m (2.3 m to 2.5 m) with a length and width of approximately 9.8 m (9.7 m to 9.9 m).

In some embodiments, the solar cell forming apparatus 200 includes a rotatable substrate support 220 configured to hold a plurality of substrates 230 on a plurality of surfaces 222 where each of the plurality of surfaces 222 are disposed facing an interior surface of the vacuum chamber. In some embodiments, each one of the plurality of substrates 230 include a suitable material such as, for example, glass. In other embodiments, one or more of the plurality of substrates 230 include a flexible material. In some embodiments, the flexible material includes stainless steel. In other embodiments, the flexible material includes plastic. In various embodiments, the rotatable substrate support 220 is shaped as a polygon. For example, in the illustrated embodiment, a plurality of substrates 230 are held on a plurality of surfaces 222 in a substantially octagonal shaped rotatable substrate support 220. In other embodiments, for example, the substrate support 220 may be rectangular shaped. Any suitable shape can be used for the rotatable substrate support 220.

As shown in FIG. 1, the substrate support 220 is rotatable about an axis in the vacuum chamber. FIG. 1 illustrates a clockwise direction of rotation for the rotatable substrate support 220. In other embodiments, substrate support 220 is configured to rotate in a counter-clockwise direction. In various embodiments, the rotatable substrate support 220 is operatively coupled to a drive shaft, a motor, or other mechanism that actuates rotation relative to a surface of the vacuum chamber. In some embodiments, substrate support 220 is rotated at a speed, for example, between approximately 5 and 200 RPM (e.g. 3 and 205 RPM). In various embodiments, a speed of rotation of the rotatable substrate support 220 is selected to minimize excessive deposition of absorption components on the plurality of substrates 230. In some embodiments, the substrate support rotates at a speed of approximately 80 RPM (e.g. 75-85 RPM). In some embodiments, the apparatus 200 includes a rotatable drum 210 disposed within the vacuum chamber and coupled to a first surface of the vacuum chamber. As illustrated in FIG. 1, the rotatable drum 210 can be disposed within the vacuum chamber. In the illustrated embodiment, the rotatable drum 210 is operatively coupled to the substrate support 220. As shown, the rotatable drum 210 has a shape that corresponds to the shape of the substrate support 220. However, the rotatable drum can have any suitable shape.

In various embodiments, the apparatus 200 includes a first sputtering source 235 configured to deposit a plurality of absorber layer particles of a first type over at least a portion of a surface of each one of the plurality of substrates 230. As shown in FIG. 1, the first sputtering source 235 can be disposed within a vacuum chamber between the substrate support 220 and the housing. The first sputtering source 235 can be coupled to a surface of the vacuum chamber. The first sputtering source 235 can be, for example, a magnetron, an ion beam source, a RF generator, or any suitable sputtering source configured to deposit a plurality of absorber layer particles of a first type over at least a portion of a surface of each one of the plurality of substrates 230. In some embodiments, the first sputtering source 235 includes at least one of a plurality of sputtering targets 237. The first sputtering source 235 uses a sputtering gas. In some embodiments, sputtering is performed with an argon gas. Other sputtering gases include krypton, xenon, neon, and similarly inert gases. One of ordinary skill can readily select a suitable sputter gas corresponding to the target material.

In FIG. 1, in various embodiments, a first sputtering source 235 is configured to deposit a plurality of absorber layer particles of a first type (e.g. copper (Cu)) over at least a portion of a surface of each one of the plurality of substrates 230 and a second sputtering source 235 is configured to deposit absorber layer particles of a third type (e.g. indium (In)) over at least a portion of a surface of each one of the plurality of substrates 230. In some embodiments, the first sputtering source 235 is configured to deposit a plurality of absorber layer particles of a first type (e.g. copper (Cu)) and a third type (e.g. gallium (Ga)) over at least a portion of a surface of each one of the plurality of substrates 230. In some embodiments, a first sputtering source 235 includes one or more copper-gallium sputtering targets 237 and a second sputtering source 235 includes one or more indium sputtering targets 237. For example, a first sputtering source 235 can include two copper-gallium sputtering targets and a second sputtering source 235 can include two indium sputtering targets. In some embodiments, a copper-gallium sputtering target 237 includes a material of approximately 70 to 80% (e.g. 69.5 to 80.5%) copper and approximately 20 to 30% (e.g. 19.5 to 30.5%) gallium. In various embodiments, the solar cell forming apparatus 200 has a first copper-gallium sputtering target 237 at a first copper:gallium concentration and a second copper-gallium sputtering target 237 at a second copper:gallium concentration for grade composition sputtering. For example, a first copper-gallium sputtering target can include a material of 65% copper and 35% gallium to control monolayer deposition to a first gradient gallium concentration and a second copper-gallium sputtering target can include a material of 85% copper and 15% gallium to control monolayer deposition to a second gradient gallium concentration. The plurality of sputtering targets 237 can be any suitable size. For example, the plurality of sputtering targets 237 can be approximately 15 cm wide (e.g. 14-16 cm) and approximately 1.9 m tall (e.g. 1-8-2.0 m).

In some embodiments, a sputtering source 235 that is configured to deposit a plurality of absorber layer particles of indium over at least a portion of the surface of each one of the plurality of substrates 230 can be doped with sodium (Na). For example, an indium sputtering target 237 of a sputtering source 235 can be doped with sodium (Na) elements. In some embodiments, a sputtering source 235 is a sodium-doped copper source having between approximately two and ten percent sodium (e.g. 1.95 to 10.1 percent sodium). In various embodiments, an indium sputtering source 235 can be doped with other alkali elements such as, for example, potassium. In other embodiments, apparatus 200 can include multiple copper-gallium sputtering sources 235 and multiple sodium doped indium sputtering sources 235. For example, the solar cell forming apparatus can have a 65:35 copper-gallium sputtering source 235 and an 85:15 copper-gallium sputtering source 235 for grade composition sputtering.

In various embodiments (not shown), apparatus 200 includes an evaporation source 240 configured to emit a vapor to deposit a plurality of absorber layer particles of a second type over at least a portion of the surface of each one of the plurality of substrates 230. In various embodiments, the second type is non-toxic elemental selenium. The second type can include any suitable evaporation source material. In various embodiments, the vapor condenses upon the one or more substrates 230. For example, the evaporation source 240 can be an evaporation boat, crucible, filament coil, electron beam evaporation source, or any suitable evaporation source 240. In some embodiments, the evaporation source 240 is disposed in a first subchamber of the vacuum chamber 210. In the illustrated embodiment, a first and second sputtering source 235 are disposed on opposing sides of the vacuum chamber and substantially equidistant from evaporation source 240 about the perimeter of the vacuum chamber.

In some embodiments including a plurality of sputtering sources 235 and a plurality of evaporation sources 240, apparatus 200 includes a plurality of isolation pumps 252 isolate each of the evaporation sources from each of the sputtering sources 235.

The solar cell forming apparatus 200 can include one or more heaters 217 in a heater apparatus 215 to heat the plurality of substrates 230 disposed on a plurality of surfaces 222 of the rotatable substrate support 220. In the illustrated embodiment, heater apparatus 215 is disposed about an interior surface of the rotatable substrate support 220. In some embodiments, the heater apparatus 215 can be disposed about an interior surface of a rotatable drum 210. In various embodiments, the substrate support 220 is rotatable around the heater apparatus 215. In some embodiments, the heater apparatus 215 is disposed about an exterior surface of a rotatable drum 210. In some embodiments, the heater apparatus 215 can be coupled to a surface of the vacuum chamber. The heater apparatus 215 can be rotatable. In other embodiments, the heater apparatus 215 is configured to be stationary. The one or more heaters 217 can include, but are not limited to, infrared heaters, halogen bulb heaters, resistive heaters, or any suitable heater for heating a substrate 230 during a deposition process. In some embodiments, the heater apparatus 215 can heat a substrate to a temperature between approximately 300 and 550 degrees Celsius (e.g. 295 and 555 degrees Celsius).

As shown in FIG. 1, apparatus 200 can include at least one isolation baffle 270 disposed about the at least one evaporation source 240. Isolation baffle 270 can be configured to direct a vapor of an evaporation source material to a particular portion of a surface of the plurality of substrates 230. Isolation baffle 270 can be configured to direct a vapor of an evaporation source material away from a sputtering source 235. The isolation baffle 270 and one or more isolation pumps 252 reduce contamination of one or more sputtering sources 235 by evaporation source material 222. The isolation baffle 270 can be composed of a material such as, for example, stainless steel or other similar metals and metal alloys. In some embodiments, the isolation baffle 270 is disposable. In other embodiments, the isolation baffle 270 is cleanable.

Figure 2:
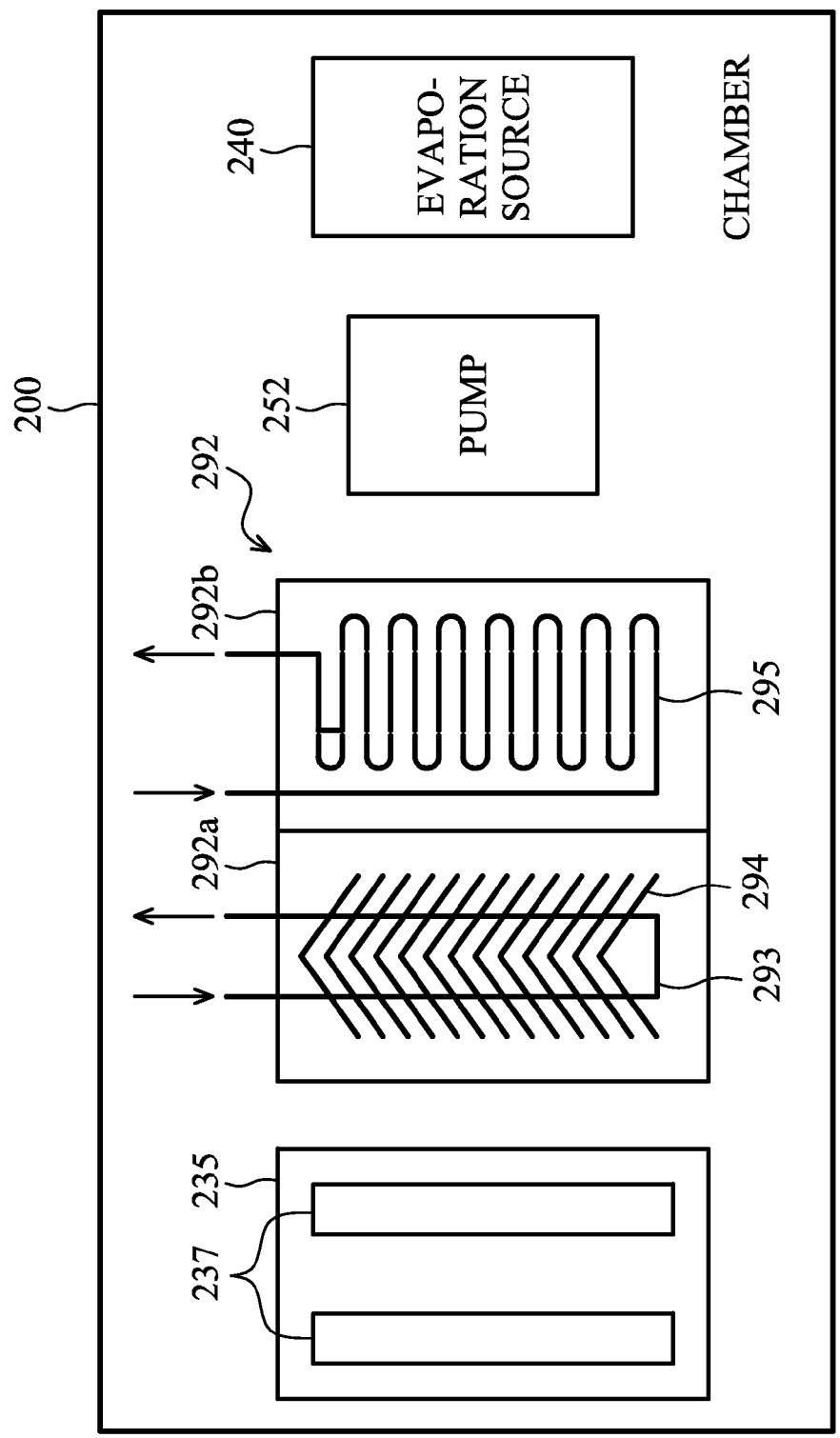
FIG. 2 is a schematic diagram showing the relative locations of the sputter source, cooling unit, pump, and evaporation source of FIG. 1.

As shown in FIGS. 1 and 2, a cooling unit 292 is provided between the sputtering source 235 and the evaporation source 240. In some embodiments, the cooling unit 292 is provided between the sputtering source 235 and the isolation (vacuum) pump 252. As shown in FIG. 2, the cooling unit 292 has a first condenser 292a for condensing remaining particles from the evaporation source 240 that are not removed by the vacuum pump 252. In some embodiments, the first condenser 292a includes a tube or pipe 293 and a plurality of fins 294 for increasing heat transfer between the first condenser 292a and the particles from the evaporation source 240. The tube or pipe 293 carries a coolant with a first temperature. In some embodiments, the coolant in the first condenser is chilled water. In other embodiments, other types of coolants are used.

Some embodiments include a single condenser 292a between the sputter source 235 and the pump 252. In other embodiments, a cooling unit 292 having the first condenser 292a further comprises a second condenser 292b between the first condenser 292a and the pump 252. The second condenser 292b can be provided for condensing any water vapor in the vicinity of the cooling unit 292, as well as removing any remaining particles of the second material (e.g., Selenium). The second condenser 292b is configured to be cooled by a second coolant having a temperature lower than the first temperature of the first coolant in the first condenser. For example, the coolant in the second condenser can be chilled to a temperature in a range from −80° C. to 0° C. Thus, the second condenser has a separate coolant inlet and coolant outlet from the respective inlet and outlet of the first condenser. The configuration of the pipe or tube 295 of the second condenser can be the same as, or different from, the configuration of the first condenser 292a. For example, in the example of FIG. 2, the tube 295 of the second condenser 292b has more turns than the tube 293 of the first condenser. In some embodiments, the second condenser is configured without fins, as shown in FIG. 2. In other embodiments (not shown), the second condenser has a plurality of fins for increasing heat transfer.

In some embodiments, an additional cooling device 218 is provided inside the drum.

Figure 3:
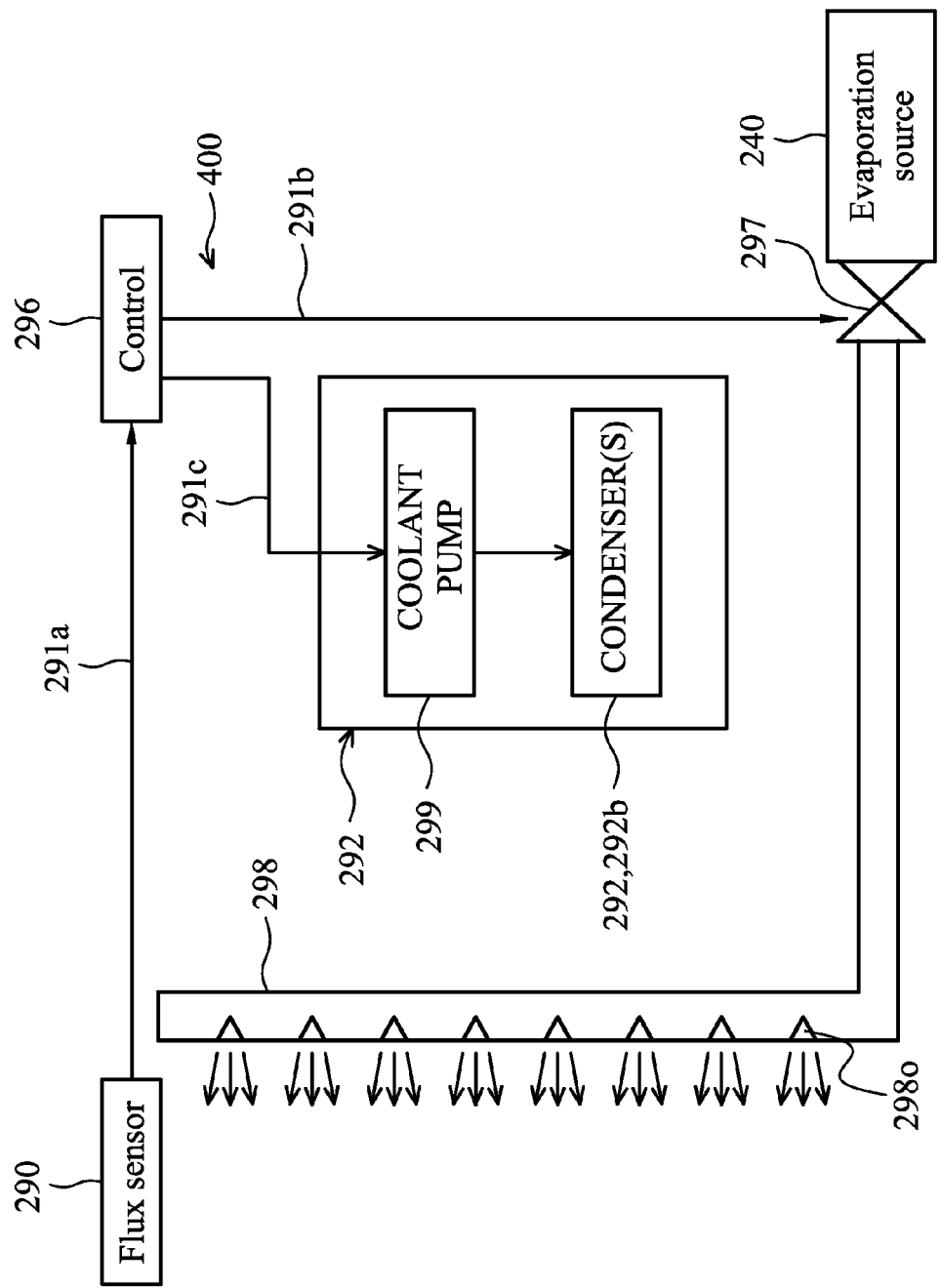
FIG. 3 is a schematic diagram of the control system for controlling the evaporation source of FIG. 1.

As shown in FIG. 3, in some embodiments, a feedback control system 400 is provided for controlling the evaporation source 240 based on a rate of mass flux emitted by the evaporation source 240. The control system 400 includes a mass flux sensor 290, positioned in front of the manifold 298 of the evaporation source 240. In some embodiments, the mass flux sensor 290 is a quartz crystal microbalance (QCM). The QCM 290 measures a mass flux per unit area by measuring the change in frequency of a quartz crystal resonator in response to the addition or removal of mass due to film deposition at the surface of the acoustic resonator. The QCM 290 outputs a signal 291a representing the mass flux rate. In some embodiments, the sensor 290 outputs the signal directly from the quartz resonator, and the calculation of the mass flux rate is performed externally (e.g., by the control unit 296). In other embodiments, the flux sensor 290 includes a special purpose processor or hardware for performing the calculation, and outputs a digital or analog signal proportional to the mass flux rate.

The control system 400 further comprises a control unit 296 coupled to receive signals indicating a mass flux rate from the mass flux sensor 290. The control unit 296 provides an output signal 291b to control the evaporation source, based on the received signal 291a. In some embodiments, the signal 291a is an analog signal output by the quartz resonator of the flux sensor 290; the controller 296 calculates the mass flux rate based on the resonant frequency of the signal 291a. In other embodiments, the controller 296 has a table for determining the mass flux rate based on the input signal 291a. In other embodiments, the signal 291a is a digital signal, and the controller determines the mass flux rate by multiplying the signal 291a by a constant.

In various embodiments, the feedback from the mass flux rate sensor 291a can be used to control the APC valve 297 alone, the cooling unit 292 alone, or the APC valve 297 and cooling unit 292 in combination.

In various embodiments, the control unit 296 can be a programmed general purpose processor, an embedded processor, or an application specific integrated circuit (ASIC).

In some embodiments, an automatic process control valve 297 is responsive to the output signal 291b of the controller 296 to adjust the rate of mass flux from the evaporation source 240. The output signal 291a of the control unit 296 is configured to operate the valve 297 in accordance with the measured mass flux rate. The valve 297 delivers a prescribed flux of the vapor to the manifold 298 for distribution to one or more orifices 298o to be emitted towards the substrate. In some embodiments, the control algorithm uses a simple proportional control, or a proportional-integral-derivative (PID) control method. In other embodiments, the APC valve 297 uses a first rate when the measured mas flux is below a setpoint rate, and a second rate when the measured mas flux is above the setpoint rate. In some embodiments, hysteresis is included, to avoid constant switching of the APC valve 297.

In some embodiments, the valve 297 comprises a material such as Titanium or Tantalum alloy on surfaces which are exposed to the vapor from the evaporation source 240. In some embodiments, the valve 297 is from SVT Associates USA, Eden Prairie, Minn., including No. 5017758 Valve, Diaphragm and No. 5017756 Weldment, Valve bellows assembly.

In some embodiments, the cooling unit 292 is responsive to the output signal 291c to adjust a temperature at a prescribed location on or near the cooling unit 292. For example, a temperature sensor can be placed on the condenser 292b. By adjusting the temperature of the cooling unit, the removal of vapor from the evaporation source can be modulated. The control of the condenser temperature based on the mass flux rate feedback can be used in place of, or in addition to, the control of the APC valve 297 based on the mass flux rate feedback. The temperature sensor can be, but is not limited to, a thermocouple, thermistor, resistance temperature detector, or the like.

In other embodiments, the cooling unit 292 is responsive to the output signal to adjust a cooling power of the cooling unit for trapping particles emitted by the evaporation source, to prevent contamination of the sputtering targets 237. For example, in one embodiment, instead of directly controlling the APC valve 297 based on the mass flux feedback, the control unit 296 can regulate the amount of power supplied to the coolant pump 299. By varying the pump pressure, the flow rate of the coolant through the condenser(s) 292 is varied. Alternatively, or additionally, the control unit can control the power supplied to the evaporation source 240 based on the flux sensor input signal 291a.

By providing mass flux rate feedback signal 291a, and using the signal to control the cooling, the removal of the vapor (second-type particles) from evaporation source 240 can be modulated. Thus, the cooling can be reduced (i.e., temperature of first condenser 292a increased) if the signal 291a indicates that the measured mass flux rate is lower than a desired setpoint value. Conversely, so long as a satisfactory mass flux rate is maintained, the cooling can be increased (i.e., temperature of first condenser 292a decreased), to further reduce the likelihood of contamination of the sputtering targets 237, and/or to further remove any remaining water vapor from the chamber.

As described above, FIGS. 1 and 4 show an embodiment in which the mass flux rate feedback information is used to control the cooling unit 292. In some embodiments, the mass flux rate feedback from the mass flux sensor 290 is used to provide fine control of the evaporation source, to facilitate complete reaction between the sputtered material (e.g., CIG) and the vapor emitted by the evaporation source 240 (e.g., selenium). The mass flux rate feedback can be used to control the evaporation source separately from, or in combination with, controlling the cooling unit 292 based on the mass flux rate feedback. Thus, in some embodiments, the mass flux rate feedback is used to control the evaporation source 240, but not the cooling unit 292. In other embodiments, the mass flux rate feedback is used to control the cooling unit 292, but not the evaporation source 240. In other embodiments, the feedback is used to control the evaporation source 240 and the cooling unit 292.

Referring again to FIG. 1, in some embodiments, apparatus 200 can include one or more in-situ monitoring devices 260 to monitor process parameters such as temperature, chamber pressure, film thickness, or any suitable process parameter. In various embodiments, apparatus 200, can include a load lock chamber 282 and/or an unload lock chamber 284. In embodiments of the present disclosure, apparatus 200 can include a buffer subchamber 255 (e.g. a buffer layer deposition subchamber) configured in-situ in apparatus 200 with a vacuum break. In some embodiments, a buffer layer deposition subchamber 255 configured in-situ in apparatus 200 with a vacuum break includes a sputtering source (not shown) including one or more sputtering targets (not shown). In various embodiments, apparatus 200 includes a sputtering source (not shown) disposed in a subchamber of the vacuum chamber and configured to deposit a buffer layer over a surface of each one of the plurality of substrates 230 in substrate support 230. In various embodiments, apparatus 200 includes an isolation pump 252 to isolate the buffer layer sputtering source from an evaporation source and/or an absorber monolayer sputtering source. The buffer layer material can include, for example, non-toxic ZnS—O or CdS.

The apparatus 200 of FIG. 1 can also be used to form solar cells of different absorber films, for example, a copper-zinc-tin-sulfur-selenium (CZTSS) absorber film. In some embodiments, a number of CZTSS absorber layer are formed in apparatus 200 by further providing tin, copper, zinc, or copper/zinc targets, as targets 237. The evaporation source 240 may use sulfur, selenium or both sulfur and selenium as source material. Additionally, another evaporation source 240 may be used to separately provide selenium and sulfur source material.

Figure 4:
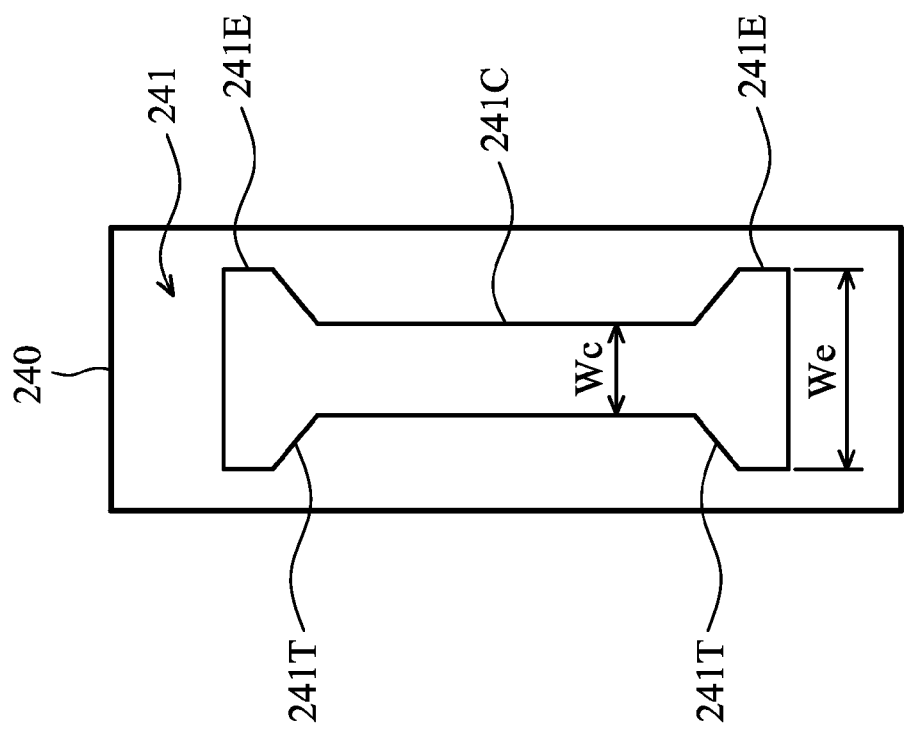
FIG. 4 is a front elevation view of the slot of the evaporation source of FIG. 1.

FIG. 4 shows another feature of some embodiments. The inventor has determined that the shape of the slot can affect the uniformity of the selenium deposited on the substrate 230. For example, if the aperture of the evaporation source 240 is rectangular, a film formed by the emitted vapor from the evaporation source 240 can be thinner at the ends than at the center. As shown in FIG. 4, an evaporation source 240 in the chamber 200 is configured to deposit a plurality of particles over a portion of the surface of the substrate 230. The evaporation source 240 has an aperture 241 with a center region 241C and two end regions 241E. The aperture 241 has a width in the end regions 241E that is greater than a width in the center region 241C. In the example of FIG. 4, the width We at the end regions is about twice the width Wc at the center region.

In other embodiments, the ratio of We/Wc can differ from the 2:1 ratio of FIG. 4. The ratio of We/Wc can be greater than 2 or between 1 and 2. So long as the resulting film thickness of the film deposited by the evaporation source 241 is greater at the center than at the ends, the ratio of We/Wc can be increased further, to improve the thickness uniformity. Conversely, if the thickness of the film deposited by the evaporation source 241 is thinner at the center than at the ends, the ratio of We/Wc can be decreased, to improve the thickness uniformity.

In the example of FIG. 4, the aperture 241 has tapered regions 241T between the center region 241C and the end regions 241E. The tapered regions 241T avoid step discontinuities in the width of the aperture, so that the film thickness varies smoothly. In some embodiments, the tapered regions 241T have straight edges, as shown in FIG. 4. In other embodiments, the tapered regions 241T have smoothly curved edges, so that the rate of change in the aperture width varies continuously along the length of the aperture 241.

The features of the apparatus described above can be used in various combinations with each other. For example, in some embodiments, the aperture 241 of FIG. 4 is used in the apparatus of FIG. 1. In other embodiments, the apparatus of FIG. 1 has an evaporation source 240 with a rectangular aperture. In some embodiments, the evaporation source 240 with the aperture 241 of FIG. 5 is used with the cooling unit 292 of FIG. 2, and the feedback control of FIG. 3. In other embodiments, the evaporation source 240 with the aperture 241 of FIG. 5 is used with the cooling unit 292 of FIG. 2, but without the feedback control of the cooling unit as shown in FIG. 3. In other embodiments, the evaporation source 240 with the aperture 241 of FIG. 5 is used with the mass flux feedback control of FIG. 3, but without the cooling unit 292.

FIG. 5 is a flow chart of an example of a method using the apparatus of FIGS. 1-4.

At step 500, a substrate is supported on a rotating support within a chamber. In some embodiments, a plurality of substrates are supported on the rotating support.

At step 502, particles of a first type are sputtered from a sputter source over at least a portion of a surface of the substrate.

At step 504, particles of a second type are deposited from an evaporation source over the portion of the surface of the substrate.

At step 506, a change in frequency of a quartz crystal resonator due to deposition of particles of the second type on the quartz crystal is measured.

At step 508, the rate of mass flux emitted by the evaporation source is determined based on the change in frequency.

At step 510, an automatic process control valve is controlled based on the sensed rate of mass flux, to regulate the mass flux emitted by the evaporation source.

At step 512, the evaporation source is controlled based on a rate of mass flux emitted by the evaporation source.

At step 514, a first region of the chamber between the sputtering source and the evaporation source is cooled, to condense particles from the evaporation source. By controlling temperature in the first region of the chamber between the sputtering source and the evaporation source, the method can cool the first region sufficiently to condense the particles of the second type and substantially prevent the particles of the second type from contaminating the sputter source; thus, the method can reduce or eliminate contamination of the sputter source by the particles of the second type (from the evaporation source).

At step 516, a second region between the first region and the exhaust pump is cooled to a temperature lower than a temperature of the first region, to condense any water vapor near the exhaust pump.

At step 518, a determination is made whether the sensed mass flux rate is greater than the target mass flux rate for complete reaction between the first and second materials. If the sensed mass flux rate is greater than the target, step 520 is performed. Otherwise, step 518 is performed.

At step 520, the temperature of the first region is lowered if the rate of mass flux emitted by the evaporation source is greater than a target mass flux rate.

At step 522, a determination is made whether the sensed mass flux rate is less than the target mass flux rate for complete reaction between the first and second materials. If the sensed mass flux rate is less than the target, step 524 is performed. Otherwise, execution ends at step 526.

At step 524, the temperature of the first region is raised if the rate of mass flux rate emitted by the evaporation source is less than the target mass flux rate.

In some embodiments, apparatus for forming a solar cell comprises: a housing defining a chamber including a substrate support therein. A sputtering source is configured to deposit particles of a first type over at least a portion of a surface of a substrate on the substrate support. An evaporation source is configured to deposit a plurality of particles of a second type over the portion of the surface of the substrate. A cooling unit is provided between the sputtering source and the evaporation source. A control system is provided for controlling the evaporation source based on a rate of mass flux emitted by the evaporation source.

In some embodiments, apparatus for forming a solar cell comprises a housing defining a chamber including a rotatable substrate support therein. A sputtering source is configured to deposit particles of a first type over at least a portion of a surface of a substrate on the substrate support. An evaporation source in the chamber is configured to deposit a plurality of particles of a second type over the portion of the surface of the substrate. The evaporation source has an aperture with a center region and two end regions. The aperture has a width in the end regions that is greater than a width in the center region.

In some embodiments, a method comprises supporting a substrate on a support within a chamber; sputtering particles of a first type from a sputter source over at least a portion of a surface of the substrate; depositing particles of a second type from an evaporation source over the portion of the surface of the substrate; cooling a region of the chamber between the sputtering source and the evaporation source; and controlling the evaporation source based on a rate of mass flux emitted by the evaporation source.

Although the subject matter has been described in terms of exemplary embodiments, it is not limited thereto. Rather, the appended claims should be construed broadly, to include other variants and embodiments, which may be made by those skilled in the art.

What is claimed is:

1. Apparatus for forming a solar cell, comprising:
a housing defining a chamber including a rotatable substrate support therein and an outer structure located radially outward from the substrate support;
a sputtering source, configured to deposit particles of a first type over at least a portion of a surface of a substrate on the substrate support;
an evaporation source configured to deposit a plurality of particles of a second type over the portion of the surface of the substrate;
a cooling unit between the sputtering source and the evaporation source; and
a control system including a mass flux sensor and a control unit coupled to receive signals indicating a mass flux rate from the mass flux sensor, the control unit providing an output signal, and the cooling unit is responsive to the output signal to adjust a cooling power of the cooling unit to trap particles of the second type to prevent contamination of the sputter source; and
wherein the sputtering source, cooling unit, and evaporation source are arranged sequentially along the outer structure around the substrate support, and the cooling unit includes a first condenser on a flat member arranged to face the substrate on the substrate support when the substrate is rotated past the cooling unit.

2. The apparatus of claim 1, wherein the control unit is responsive to the signals from the mass flux sensor to control the evaporation source.

3. The apparatus of claim 2, further comprising an automatic process control valve responsive to the output signal to adjust the rate of mass flux from the evaporation source.

4. The apparatus of claim 2, wherein the cooling unit is responsive to the output signal to adjust a temperature at a prescribed location on or near the cooling unit.

5. The apparatus of claim 1, wherein the mass flux sensor is a quartz crystal microbalance.

6. The apparatus of claim 1, further comprising a vacuum pump between the evaporation source and the cooling unit along the outer structure around the substrate support for removing particles of the second type from a portion of the chamber near the sputtering source, wherein the first condenser is positioned for condensing remaining particles of the second type that are not removed by the vacuum pump.

7. The apparatus of claim 6, wherein the first condenser is configured to be cooled by a first coolant with a first temperature, the cooling unit further comprising a second condenser between the first condenser and the pump, the second condenser to be cooled by a second coolant having a temperature lower than the first temperature.

8. The apparatus of claim 1, further comprising a vacuum pump between the evaporation source and the cooling unit for removing particles of the second type from a portion of the chamber near the sputtering source, wherein:
the rotatable substrate support is configured to sequentially move the substrate past the sputtering source, the cooling unit, and the evaporation source,
the control unit providing an output signal to control the evaporation source, and
the first condenser is positioned for condensing remaining particles of the second type that are not removed by the vacuum pump.

9. Apparatus for forming a solar cell, comprising:
a housing defining a chamber including a rotatable substrate support therein and an outer structure located radially outward from the substrate support;
a sputtering source configured to deposit particles of a first type over at least a portion of a surface of a substrate on the substrate support; and
an evaporation source in the chamber and configured to deposit a plurality of particles of a second type over the portion of the surface of the substrate, the evaporation source having an aperture with a center region and two end regions, the aperture having a width in the end regions that is greater than a width in the center region; and
a mass flux sensor and a control unit coupled to receive signals indicating a mass flux rate from the mass flux sensor, the control unit providing an output signal, and
a cooling unit between the sputtering source and the evaporation source, the cooling unit responsive to the output signal to adjust a cooling power of the cooling unit to trap particles of the second type to prevent contamination of the sputter source; and
wherein the sputtering source, cooling unit, and evaporation source are arranged sequentially along the outer structure around the substrate support, and the cooling unit includes a first condenser on a flat member arranged to face the substrate on the substrate support when the substrate is rotated past the cooling unit.

10. The apparatus of claim 9, wherein the width at the end regions is about twice the width at the center region.

11. The apparatus of claim 9, wherein the aperture further comprises a respective tapered region between the center region and each respective end region.

12. The apparatus of claim 9, wherein the control unit provides an output signal to control the evaporation source.

13. The apparatus of claim 12, further comprising an automatic process control valve responsive to the output signal to adjust the rate of mass flux from the evaporation source.

14. The apparatus of claim 12, wherein the cooling unit is responsive to the output signal to adjust a temperature at a prescribed location on or near the cooling unit.

15. The apparatus of claim 9, further comprising a vacuum pump between the evaporation source and the cooling unit along the outer structure around the substrate support for removing particles of the second type from a portion of the chamber near the sputtering source, wherein:
the control unit provides an output signal to control the evaporation source, and
the first condenser is positioned for condensing remaining particles of the second type that are not removed by the vacuum pump.

16. Apparatus for forming a solar cell, comprising:
a housing defining a chamber including a substrate support therein and an outer structure located radially outward from the substrate support;
a sputtering source, configured to deposit particles of a first type over at least a portion of a surface of a substrate on the substrate support;
an evaporation source configured to deposit a plurality of particles of a second type over the portion of the surface of the substrate, the evaporation source having an aperture with a center region and two end regions, the aperture having a width in the end regions that is greater than a width in the center region;
a cooling unit between the sputtering source and the evaporation source;
a control system for controlling the evaporation source based on a rate of mass flux emitted by the evaporation source, the control system including a mass flux sensor, and a control unit coupled to receive signals indicating a mass flux rate from the mass flux sensor, the control unit providing an output signal to control the evaporation source, where the cooling unit is responsive to the output signal to adjust a cooling power of the cooling unit to trap excess particles of the second type to prevent contamination of the sputter source; and
a vacuum pump between the evaporation source and the cooling unit for removing particles of the second type from a portion of the chamber near the sputtering source, wherein:
the sputtering source, cooling unit, vacuum pump and evaporation source are arranged sequentially along the outer structure around the substrate support,
the cooling unit has a first condenser for condensing remaining particles of the second type that are not removed by the vacuum pump, and
the substrate support is rotatable to sequentially move the substrate past the sputtering source, the cooling unit, the vacuum pump and the evaporation source, and the first condenser is located on a flat member arranged to face the substrate on the substrate support when the substrate is rotated past the cooling unit.

* * * * *